United States Patent
Hashimoto

[19]

[11] Patent Number: 5,942,809
[45] Date of Patent: Aug. 24, 1999

[54] METHOD AND APPARATUS FOR GENERATING INTERNAL SUPPLY VOLTAGE

[75] Inventor: Yuki Hashimoto, Tokyo, Japan

[73] Assignee: Oki Electric Industry Co., Ltd., Tokyo, Japan

[21] Appl. No.: 08/998,424

[22] Filed: Dec. 24, 1997

[51] Int. Cl.⁶ ...................................................... H02J 1/00
[52] U.S. Cl. ........................... 307/43; 307/112; 307/116; 327/540
[58] Field of Search ................................ 307/43, 52, 112, 307/149, 116, 125; 327/543, 545, 546, 540, 541, 542, 530; 365/201

[56] References Cited

U.S. PATENT DOCUMENTS

| | | | |
|---|---|---|---|
| 5,812,021 | 9/1998 | Ikeda | 327/541 |
| 5,847,597 | 12/1998 | Ooishi et al. | 327/543 |
| 5,856,756 | 1/1999 | Sasahara et al. | 327/540 |

FOREIGN PATENT DOCUMENTS 5-205469  8/1993  Japan .

Primary Examiner—Jeffrey Gaffin
Assistant Examiner—Peter Zura
Attorney, Agent, or Firm—Jones Volentine, L.L.P.

[57] ABSTRACT

An apparatus and method for generating an internal supply voltage for a semiconductor integrated circuit, includes a first voltage generator which generates a voltage in response to a predetermined characteristic of the semiconductor integrated circuit, a second voltage generator which generates a second voltage from a reference voltage generator, and a selecting circuit which selects from among the first and second voltage. The selected voltage is suppled to an internal supply voltage generator which generates therefrom an internal supply voltage for the semiconductor integrated circuit. The first voltage is selected for regulating the internal supply voltage, being controlled in level according to the characteristic of the semiconductor integrated circuit.

25 Claims, 4 Drawing Sheets

5,942,809

METHOD AND APPARATUS FOR GENERATING INTERNAL SUPPLY VOLTAGE

TECHNICAL FIELD OF THE INVENTION

The present invention relates to a semiconductor integrated circuit, and more particularly to a method and an apparatus for generating an optimum level of internal supply voltage for a semiconductor integrated circuit.

BACKGROUND OF THE INVENTION

A semiconductor integrated circuit, which may include a memory device, is provided with an internal supply voltage generator to provide an optimum voltage lower than an external voltage. Such an internal supply an voltage is applied to various internal circuits to drive them.

A conventional internal supply voltage generation circuit is described in Japanese Patent Laying Open Kokai No. H5-205469. In the conventional internal supply voltage generation circuit, a reference voltage and an external supply voltage are selectively used to generate an internal supply voltage.

In general, device characteristics including supply current and access time vary in response to the level of such an internal supply voltage. The internal supply voltage varies in response to an external supply voltage, temperature, process parameters, and the like. For providing an optimum internal supply voltage, a reference voltage and/or the internal supply voltage are corrected in level with a trimming circuit.

According to the above mentioned conventional circuit, it is difficult to obtain an optimum internal supply voltage without expanding an area of the trimming circuit in the semiconductor integrated circuit. This means that it is required to increase the number of fuses and other electrical components to be mounted in the trimming circuit for expanding the rage of level correction (trimming) and narrowing the interval of each correction level. When the area of the trimming circuit is expanded, the area of the semiconductor integrated circuit is eventually expanded as well.

OBJECTS OF THE INVENTION

Accordingly, an object of the invention is to provide a method and apparatus for generating an internal supply voltage, in which an optimum internal supply voltage can be obtained without expanding the size of the semiconductor integrated circuit.

Another object of the invention is to provide a semiconductor integrated circuit in which an optimum internal supply voltage can be obtained without expanding the size thereof.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a method for generating an internal supply voltage for a semiconductor integrated circuit, includes the steps of: generating a first voltage in response to a predetermined characteristic of the semiconductor integrated circuit; generating a second voltage; selecting one from the first voltage and the second voltage; and generating in response to the selected voltage an internal supply voltage.

According to a second aspect of the invention, an apparatus for generating an internal supply voltage for a semiconductor integrated circuit includes a first voltage generator which generates a first voltage in response to a predetermined characteristic of the semiconductor integrated circuit. The apparatus further includes a second voltage generator which generate a second voltage; a selecting circuit which is supplied with the first voltage and the second voltage to select one from the first and second voltages; and an internal supply voltage generator which is supplied with the selected voltage to generate an internal supply voltage.

According to a third aspect of the invention, a semiconductor integrated circuit includes a semiconductor devices and the above mentioned apparatus of the second aspect of the invention.

In each aspect of the invention, the first voltage is generated in response to a predetermined characteristic of the semiconductor integrated circuit, such as supply current and access time of the integrated circuit. And, the first voltage and the second voltage are selectively used to generate an internal supply voltage. For regulating the internal supply voltage, the first voltage is controlled in level and is selected for use. Therefore, a trimming circuit can be minimized in size to obtain an optimum internal supply voltage.

DETAILED DISCLOSURE OF THE INVENTION

Figure 1:
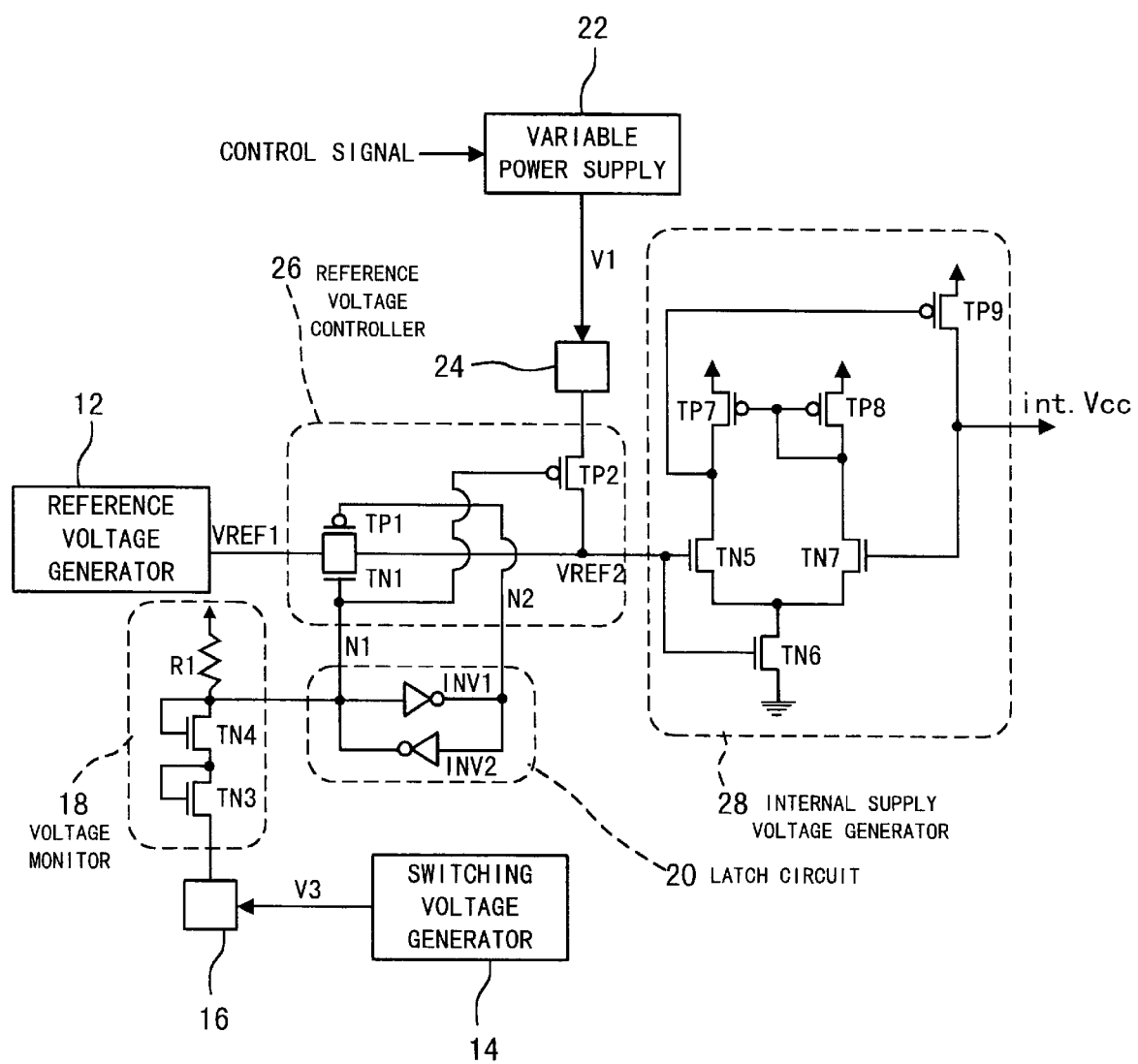
FIG. 1 is a block diagram illustrating an apparatus for generating an internal supply voltage, according to a first preferred embodiment of the invention.

FIG. 1 shows an apparatus for generating an internal supply voltage, according to a first preferred embodiment of the invention. The apparatus includes a reference voltage generator 12 which generates a reference voltage VREF1, a switching voltage generator 14 which generates and applies a switching voltage V3 to a bonding pad 16, and a voltage monitor 18 connected to the bonding pad 16. The reference voltage generator 12, for example, generates the reference voltage VREF1 of 2.7V. The switching voltage generator 14, for example, generates the switching voltage V3 of 0V or 2V. The voltage monitor 18 is designed to detect a level of the voltage V3 applied at the bonding pad 16.

The apparatus further includes a latch circuit 20 connected to the voltage monitor 18 to latch an output signal of the voltage monitor 18. The latch circuit 20 is also connected to a reference voltage controller 26, which is connected to the reference voltage generator 12 and is supplied with the reference voltage VREF1. The apparatus is also provided with a variable power supply 22 which generates a variable voltage V1 in response to a control signal, which is produced based on the characteristics of devices mounted in the semiconductor integrated circuit, such as supply current and access time. The voltage V1, for example, may be in the range of 2.5V to 3.0V. The voltage V1 is applied to a bonding pad 24, which is connected to the reference voltage controller 26.

The reference voltage controller 26 is designed to select one from the reference voltage VREF1 and the voltage V1. The reference voltage controller 26 is also connected to an internal supply voltage generator 28, which eventually generates an internal supply voltage "int.Vcc" in accordance with the output (VREF2) of the reference voltage controller 26.

The voltage monitor 18 includes NMOS transistors TN3 and TN4 and a resistor R1. The NMOS transistor TN3 is connected at a source to the bonding pad 16. The other NMOS transistor TN4 is connected at a source to a drain and a gate of the NMOS transistor TN3, and at a drain and a gate to the resistor R1 and a node N1. The resistor R1 is applied with an external supply voltage.

The latch circuit 20 includes two inverters INV1 and INV2. The INV1 is connected at an input terminal to the node N1, and at an output terminal to a node N2. The inverter INV2 is connected at an input terminal to the node N2 and at an output terminal to the node N1.

The reference voltage controller 26 includes an NMOS transistor TN1, and PMOS transistors TP1 and TP2. The NMOS transistor TP1 is connected at an gate to the node N1, at a source (drain) to the reference voltage generator 12, and at a drain (source) to the internal supply voltage generator 28. The PMOS transistor TP1 is connected at a gate to the node N2, at a source (drain) to the reference voltage generator 12, and at a drain (source) to the internal supply voltage generator 28. The PMOS transistor TP2 is connected at a gate to the node N1, at a source to the bonding pad 24, and at a drain to the internal supply voltage generator 28.

The internal supply voltage generator 28 includes NMOS transistors TN5, TN6 and TN7, and PMOS transistors TP7, TP8 and TP9. The NMOS transistor TN5 is connected at a gate to a gate of the NMOS transistor TN6, at a source to a drain of the NMOS transistor TN6, and at a drain to a drain of the PMOS transistor TP7 and to a gate of the PMOS transistor TP9. The voltage VREF2 is supplied from the reference voltage controller 26 to the gates of the NMOS transistors TN5 and TN6. The NMOS transistor TN6 is grounded at a source. The NMOS transistor TN7 is connected at a gate to a drain of the PMOS transistor TP9 and to the output terminal (int.Vcc), and at a drain to gate and drain of the PMOS transistor TP8. The PMOS transistor TP7 is connected at a gate to the gate of the PMOS transistor TP8 and to the drain of the NMOS transistor TN7, at a drain to a gate of the PMOS transistor TP9, and at a source to the external supply voltage. The PMOS transistor TP8 is connected at an source to the external supply voltage. The PMOS transistor TP9 is connected at a source to the external supply voltage "ext.Vcc," and at the drain to the output terminal (int.Vcc).

In operation, when the switching voltage generator 14 applies a voltage of 0V to the bonding pad 16, the nodes N1 and N2 turn to high and low in level, respectively, by the function of the resistor R1. The condition is latched by the latch circuit 20. Each of the transistors TP1 and TN1 in the reference voltage controller 26 turns on, in response to the output signal of the latch circuit 20. Thus, the reference voltage VREF1 is supplied to the internal supply voltage generator 28. In this case, the PMOS transistor TP2 turns off, so that the internal supply voltage generator 28 generates an internal supply voltage "int.Vcc" based on the reference voltage VREF1 (VREF2).

On the other hand, when the switching voltage generator 14 generates and applies a voltage, which is lower than an input voltage of the chip, to the bonding pad 16, the nodes N1 and N2 turn to low and high in level respectively. The input voltage is a voltage to be applied to an input pin of the semiconductor integrated circuit (chip). The condition of the nodes N1 and N2 is latched by the latch circuit 20. In this case, both the transistors TP1 and TN1 turn off, while the transistor TP2 turns on. Thus, the voltage V1 applied to the bonding pad 24 is supplied as a voltage VREF2 to the internal supply voltage generator 28. The internal supply voltage generator 28 generates an internal supply voltage "int.Vcc" based on the voltage V1 (VREF2).

According to the above described embodiment, the voltage VREF2 to be supplied to the internal supply voltage generator 28 is selected from the reference voltage VREF1 and the variable voltage V1, so that an optimum supply voltage can be easily obtained.

Figure 2:
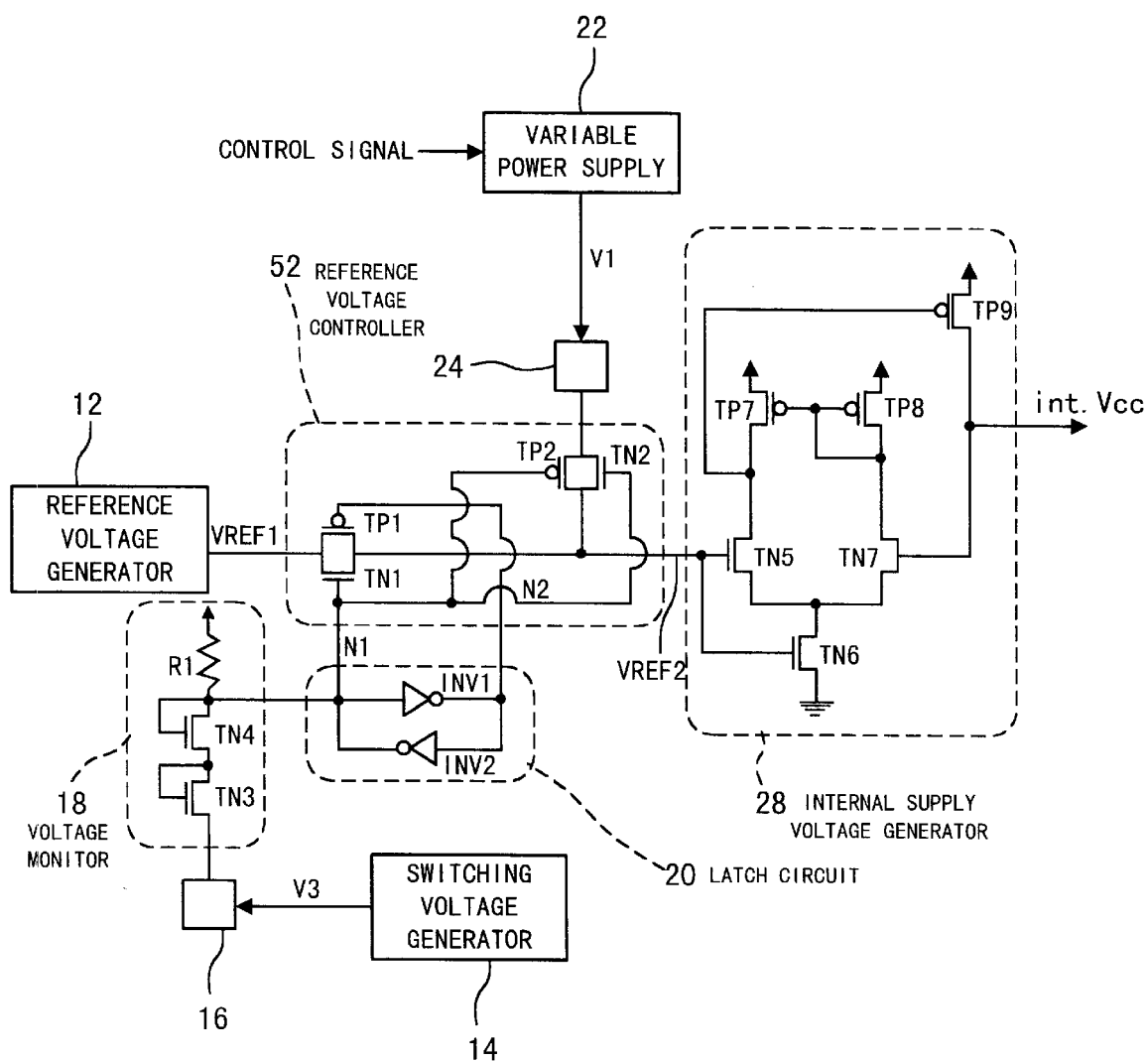
FIG. 2 is a block diagram illustrating an apparatus for generating an internal supply voltage, according to a second preferred embodiment of the invention.

FIG. 2 shows an apparatus for generating an internal supply voltage, according to a second preferred embodiment of the invention. In this embodiment, the same or corresponding components to the first preferred embodiment shown in FIG. 1 are represented by the same symbols. And, the same description is not repeated here in the second preferred embodiment to avoid redundant description. The apparatus of the second preferred embodiment includes a different type of reference voltage controller 52 which is provided with an NMOS transistor TN2. The NMOS transistor TN2 is connected at a gate to the node N2 and at a drain to the bonding pad 24. A source of the NMOS transistor TN2 is connected to the drain/source of the PMOS transistor TP1, the source/drain of the NMOS transistor TN1 and to the gate of the NMOS transistor TN5 in the internal supply voltage generator 28.

The operation of the second preferred embodiment is basically the same as that of the first preferred embodiment. The difference from the first preferred embodiment is as follows: In the first preferred embodiment, the PMOS transistor TP2 turns off when the voltage V1 becomes lower than the absolute value of threshold level Vt of the transistor TP2. If it is assumed that the threshold level Vt of the PMOS transistor TP2 is "–1V," the transistor TP2 turns off when a voltage of 0V is applied to its gate and the voltage V1 becomes lower than 1V. In contrast, in the second preferred embodiment, even though the PMOS transistor TP2 turns off, the voltage V1 is still applied to the internal supply voltage generator 28, because the NMOS transistor TN2 keeps turned on. In other words, according to the second preferred embodiment, the variable voltage V1 can be supplied to the internal supply voltage generator 28 independent from the level of the voltage V1 at the bonding pad 24.

Figure 3:
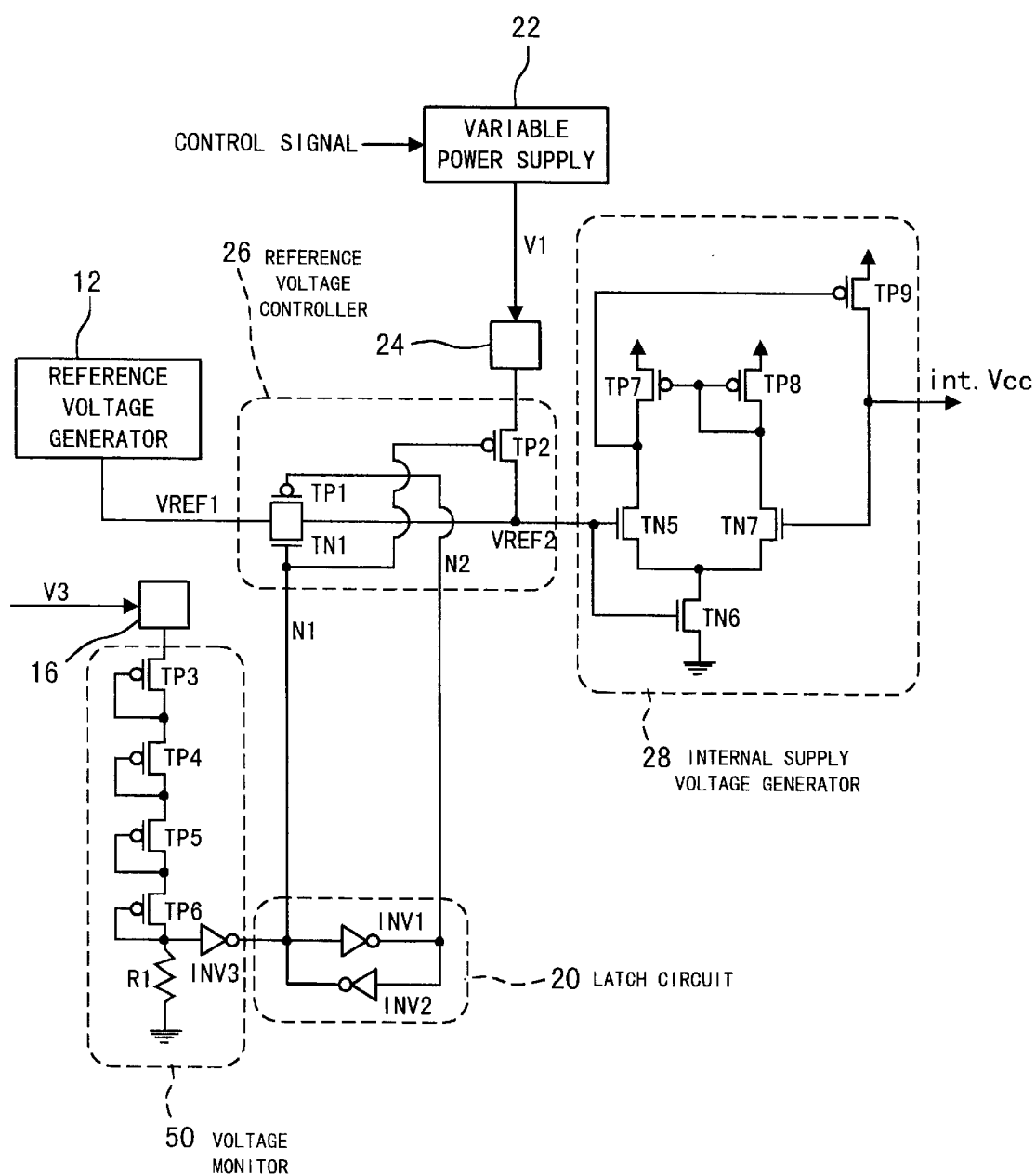
FIG. 3 is a block diagram illustrating an apparatus for generating an internal supply voltage, according to a third preferred embodiment of the invention.

FIG. 3 shows an apparatus for generating an internal supply voltage, according to a third preferred embodiment of the invention. In this embodiment, the same or corresponding components to the first preferred embodiment shown in FIG. 1 are represented by the same symbols. And, the same description is not repeated here in the third preferred embodiment to avoid redundant description. The apparatus of the third preferred embodiment includes a different type of voltage monitor 50. The voltage monitor 50 includes PMOS transistors TP3, TP4, TP5 and TP6, a resistor R1, and an inverter INV3. The PMOS transistor TP3 is connected at a drain to the bonding pad 16. The inverter INV3 is connected at an input terminal to the resistor R1 and to a gate of the PMOS transistor TP6, and at an output terminal to the node N1.

The operation of the third preferred embodiment is basically the same as that of the first preferred embodiment. The difference from the first preferred embodiment is as follows: In the first preferred embodiment, the node N1 turns to low in level when a voltage V3 that is lower than the input voltage of the chip is applied to the bonding pad 16. In contrast, in the third preferred embodiment, the node N1 turns to low in level when a voltage V3 that is higher than the operating voltage of the chip is applied to the bonding pad 16.

Figure 4:
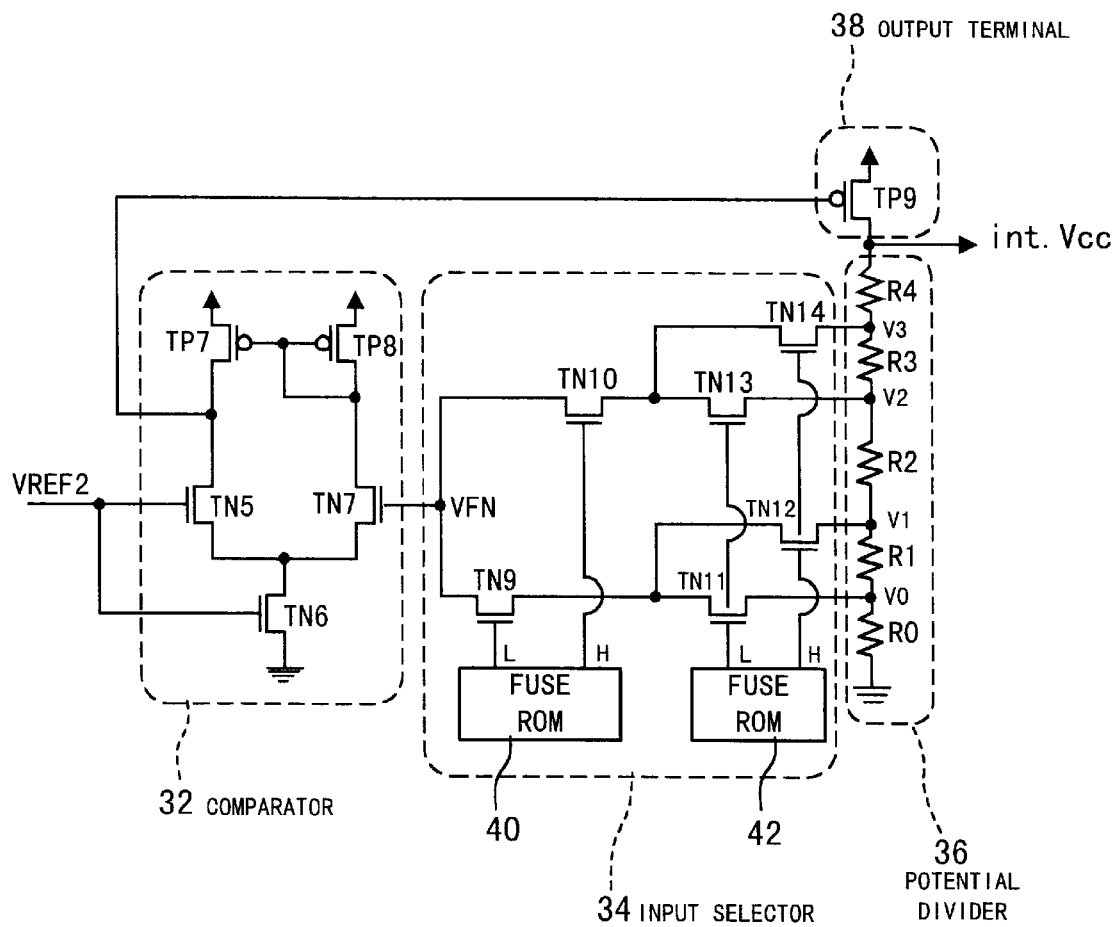
FIG. 4 is a block diagram illustrating an internal supply voltage generator with a trimming circuit, according to a fourth preferred embodiment of the invention.

FIG. 4 shows an internal supply voltage generator with a trimming circuit, according to a fourth preferred embodiment of the invention. The internal supply voltage generator of the fourth preferred embodiment can be employed instead of the internal supply voltage generator 28 in each of the first to third preferred embodiments. In other words, the different between the fourth preferred embodiment and the other embodiments is to include a trimming function therein. In this embodiment, the same or corresponding components to the first to third preferred embodiments shown in FIGS. 1 to 3 are represented by the same symbols. And, the same description is not repeated here in the fourth preferred embodiment to avoid redundant description.

The internal supply voltage generator includes a comparator 32, an input selector 34, a potential divider 36 and an output terminal 38. It can be said that the internal supply voltage generator 28 of the first to third preferred embodiment is composed of the comparator 32 and the output terminal 38. The trimming circuit is basically composed of the input selector 34 and the potential divider 36.

The input selector 34 includes NMOS transistors TN9 to TN14 and fuse ROMs 40 and 42. The NMOS transistor TN9 is connected at a gate to a low terminal of the fuse ROM 40, and at a source (drain) to the gate of the NMOS transistor TN7 and to a source (drain) of the NMOS transistor TN10, and at a drain to a source (drain) of the NMOS transistor TN11 and to a source (drain) of the NMOS transistor TN12. The NMOS transistor TN10 is connected at a gate to a high terminal of the fuse ROM 40, and at a drain (source) to a source (drain) of the NMOS transistor TN13 and a source (drain) of the NMOS transistor TN14. The NMOS transistor TN 11 is connected at a gate to a low terminal of the fuse ROM 42, and at a source (drain) to a source (drain) of the NMOS transistor TN12, and at a drain (source) to the potential divider 36. The NMOS transistor TN12 is connected at a gate to a high terminal of the fuse ROM 42 and at a drain (source) to the potential divider 36. The NMOS transistor TN13 is connected at a gate to the low terminal of the fuse ROM 42, and at a drain (source) to the potential divider 36. The NMOS transistor Tn14 is connected at a gate to the high terminal of the fuse ROM 42 and at a drain (source) to the potential divider 36.

The potential divider 36 includes resistors R0 to R4, which are connected in series in order. The resistor R0 is grounded at one end. The resistor R4 is connected to the drain of the PMOS transistor TP9 and to the output terminal (int.Vcc). The node between the resistors R0 and R1 is connected to the drain (source) of the NMOS transistor TN11. The node between the resistors R1 and R2 is connected to the drain (source) of the NMOS transistor TN12. The node between the resistors R2 and R3 is connected to the drain (source) of the NMOS transistor TN13. The node between the resistors R3 and R4 is connected to the drain (source) of the NMOS transistor TN14.

In operation, fuses in the fuse ROMs 40 and 42 are selectively cutoff with laser to select one (VIN) from voltages V0 to V3. The selected voltage VFN is supplied to the gate of the NMOS transistor TN7 in the comparator 32, so that an internal supply voltage "int.Vcc" is generated based on the voltage VREF2 and the voltage VFN.

According to a conventional technology, for expanding the range of trimming and narrowing the interval of each trimming level, it is required to increase the number of fuse ROMs, NMOS transistors and resistors in the potential divider 36. In contrast, according to the invention, the same effect can be obtained by controlling the voltage V1, shown in FIGS. 1 to 3. In other words, according to the present invention, it is not required to scale up the inning circuit to obtain an optimum supply voltage (int.Vcc).

In addition, according to the invention, the internal supply voltage "int.Vcc" can be controlled in level by regulating the level of the voltage V1 at the bonding pad 24, so that the acceleration factor in a reliability test can be controlled.

It will be understood that the above description of the present invention is susceptible to various modifications, changes and adaptations, and the same are intended to be comprehended with the meaning and range of equivalents of the appended claims.

What is claimed is:

1. A method for generating an internal supply voltage for a semiconductor integrated circuit, comprising the steps of:

generating a first voltage in response to a predetermined characteristic of the semiconductor integrated circuit;

generating a second voltage;

selecting one from the first voltage and the second voltage; and generating in response to the selected voltage an internal supply voltage.

2. The method according to claim 1, wherein the predetermined characteristic comprises the amount of supply current and access time of the semiconductor integrated circuit.

3. The method according to claim 1, further comprising the step of:

generating a third voltage, wherein the selecting step is performed in response to the third voltage.

4. The method according to claim 1, wherein the step of generating the internal supply voltage comprises a step of trimming the internal supply voltage in order to generate an optimum voltage.

5. The method according to claim 1, wherein the second voltage is fixed in level.

6. An apparatus for generating an internal supply voltage for a semiconductor integrated circuit, comprising:

a first voltage generator which generates a first voltage in response to a predetermined characteristic of the semiconductor integrated circuit;

a second voltage generator which generate a second voltage;

a selecting circuit which is supplied with the first voltage and the second voltage to select one from the first and second voltages; and an internal supply voltage generator which is supplied with the selected voltage to generate an internal supply voltage.

7. The apparatus according to claim 6, wherein the predetermined characteristic comprises the supply current and access time of the semiconductor integrated circuit.

8. The apparatus according to claim 6, further comprising:

a trimming circuit which trims the internal supply voltage in order to generate an optimum voltage.

9. The apparatus according to claim 6, wherein the second voltage is fixed in level.

10. The apparatus according to claim 6, further comprising:

a third voltage generator which generates a third voltage; and a voltage monitoring circuit which detects the level of the third voltage, wherein the selecting circuit operates in response to the output of the voltage monitoring circuit.

11. The apparatus according to claim 10, further comprising:

a latch circuit which holds the output of the voltage monitoring circuit to be supplied to the selecting circuit.

12. The apparatus according to claim 10, wherein the voltage monitoring circuit has a threshold voltage level of detection which is lower than an input voltage level of the semiconductor integrated circuit.

13. The apparatus according to claim 10, wherein the voltage monitoring circuit has a threshold voltage level of detection which is higher than an input voltage level of the semiconductor integrated circuit.

14. The apparatus according to claim 6, wherein the selecting circuit comprises a P-channel transistor which is connected at a terminal of source or drain to the first voltage generator and at the other terminal of drain or source to the internal supply voltage generator, so that the P-channel transistor is turned off when the first voltage is lower than the absolute value of its threshold level, and the first voltage is not supplied to the internal supply voltage generator.

15. The apparatus according to claim 14, wherein the selecting circuit further comprises an N-channel transistor which is connected at a terminal of source or drain to the first voltage generator and at the other terminal of drain or source to the internal supply voltage generator, so that the first voltage is supplied to the internal supply voltage generator even if the P-channel transistor is turned off.

16. A semiconductor integrated circuit, comprising:

semiconductor devices; and an apparatus for generating an internal supply voltage for driving the semiconductor devices, wherein the internal supply voltage generator comprises:

(1) a first voltage generator which generates a first voltage in response to a predetermined characteristic of the semiconductor integrated circuit;

(2) a second voltage generator which generate a second voltage;

(3) a selecting circuit which is supplied with the first voltage and the second voltage to select one from the first and second voltages; and (4) an internal supply voltage generator which is supplied with the selected voltage to generate an internal supply voltage.

17. The semiconductor integrated circuit according to claim 16, wherein in the apparatus for generating an internal supply voltage, the predetermined characteristic comprises the supply current and access time of the semiconductor integrated circuit.

18. The semiconductor integrated circuit according to claim 16, further comprising:

a trimming circuit which trims the internal supply voltage in order to generate an optimum voltage.

19. The semiconductor integrated circuit according to claim 16, wherein in the apparatus for generating an internal supply voltage, the second voltage is fixed in level.

20. The semiconductor integrated circuit according to claim 16, wherein:

the apparatus for generating an internal supply voltage further comprises a third voltage generator which generates a third voltage; and a voltage monitoring circuit which detects the level of the third voltage, wherein the selecting circuit operates in response to the output of the voltage monitoring circuit.

21. The semiconductor integrated circuit according to claim 20, wherein:

the apparatus for generating an internal supply voltage further comprises a latch circuit which holds the output of the voltage monitoring circuit to be supplied to the selecting circuit.

22. The semiconductor integrated circuit according to claim 20, wherein in the apparatus for generating an internal supply voltage, the voltage monitoring circuit has a threshold voltage level of detection which is lower than an input voltage level of the semiconductor integrated circuit.

23. The semiconductor integrated circuit according to claim 20, wherein in the apparatus for generating an internal supply voltage, the voltage monitoring circuit has a threshold voltage level of detection which is higher than an input voltage level of the semiconductor integrated circuit.

24. The semiconductor integrated circuit according to claim 16, wherein in the apparatus for generating an internal supply voltage, the selecting circuit comprises a P-channel transistor which is connected at a source to the first voltage generator and at a drain to the internal supply voltage generator, so that the P-channel transistor is turned off when the first voltage is lower than the absolute value of its threshold level, and the first voltage is not supplied to the internal supply voltage generator.

25. The semiconductor integrated circuit according to claim 24, wherein in the apparatus for generating an internal supply voltage, the selecting circuit further comprises an N-channel transistor which is connected at a source to the first voltage generator and at a drain to the internal supply voltage generator, so that the first voltage is supplied to the internal supply voltage generator even if the P-channel transistor is turned off.

* * * * *